US012755782B2

(12) United States Patent
Song

(10) Patent No.: US 12,755,782 B2
(45) Date of Patent: Oct. 6, 2026

(54) SEMICONDUCTOR DEVICE INCLUDING FERROELECTRIC MEMORY CELL WITH DOPED FERROELECTRIC LAYER

(71) Applicant: SK hynix Inc., Icheon-si (KR)

(72) Inventor: Jeong Hwan Song, Icheon-si (KR)

(73) Assignee: SK HYINX INC., Icheon-si (KR)

( * ) Notice: Subject to any disclaimer, the term of this patent is extended or adjusted under 35 U.S.C. 154(b) by 352 days.

(21) Appl. No.: 17/940,510

(22) Filed: Sep. 8, 2022

(65) Prior Publication Data

US 2023/0136317 A1 May 4, 2023

(30) Foreign Application Priority Data

Oct. 29, 2021 (KR) ........................ 10-2021-0146951

(51) Int. Cl.
*G11C 13/00* (2006.01)
*G11C 11/22* (2006.01)
*H10N 70/00* (2023.01)

(52) U.S. Cl.
CPC ............ *G11C 13/004* (2013.01); *G11C 11/22* (2013.01); *G11C 13/0038* (2013.01); *G11C 13/0069* (2013.01); *H10N 70/041* (2023.02); *H10N 70/841* (2023.02)

(58) Field of Classification Search
CPC .............. G11C 13/004; G11C 13/0038; G11C 13/0069; G11C 11/22; G11C 11/221; G11C 11/2259; G11C 11/2273; G11C 11/2275; G11C 11/5657; G11C 11/2297; H10N 70/841; H10N 70/041; H10N 70/20; H10B 63/845; H10B 61/00; H10B 63/84; G06F 3/0656; G06F 12/08
USPC .......................................................... 365/148
See application file for complete search history.

(56) References Cited

U.S. PATENT DOCUMENTS

| | | | | |
|---|---|---|---|---|
| 5,976,949 | A * | 11/1999 | Chen | H01L 21/76229 257/E21.549 |
| 9,960,350 | B2 | 5/2018 | Ha | |
| 12,268,008 | B2 * | 4/2025 | Jeon | G11C 11/2255 |
| 2008/0061331 | A1 * | 3/2008 | Wang | H10B 53/00 257/295 |
| 2012/0018695 | A1 | 1/2012 | Lee et al. | |
| 2019/0333565 | A1 | 10/2019 | Marotta et al. | |

(Continued)

FOREIGN PATENT DOCUMENTS

| | | | |
|---|---|---|---|
| KR | 20170137562 | A | 12/2017 |
| KR | 102025007 | B1 | 9/2019 |
| KR | 20190114919 | A | 10/2019 |

*Primary Examiner* — Allison Bernstein
(74) *Attorney, Agent, or Firm* — Ashurst Perkins Coie US LLP

(57) ABSTRACT

A semiconductor device may include at least one memory cell. The memory cell may include: a first electrode layer; a second electrode layer; and a self-selecting memory layer interposed between the first electrode layer and the second electrode layer and exhibits different resistance states for storing data and is structured to be either electrically conductive or electrically non-conductive in response to a voltage applied to the first and second electrode layers, wherein the self-selecting memory layer includes a ferroelectric layer exhibiting deep traps for trapping conductive carriers and a first dopant doped in the ferroelectric layer to form shallow traps providing a conductive path for conductive carriers to move in the ferroelectric layer.

13 Claims, 4 Drawing Sheets

(56) References Cited

U.S. PATENT DOCUMENTS

| | | | | |
|---|---|---|---|---|
| 2020/0212168 | A1* | 7/2020 | Yoo | H01L 29/78391 |
| 2023/0138698 | A1* | 5/2023 | Song | G11C 13/0038<br>365/10 |

* cited by examiner

SEMICONDUCTOR DEVICE INCLUDING FERROELECTRIC MEMORY CELL WITH DOPED FERROELECTRIC LAYER

PRIORITY CLAIM AND CROSS-REFERENCE TO RELATED APPLICATION

This patent document claims the priority and benefits of Korean Patent Application No. 10-2021-0146951 filed on Oct. 29, 2021, which is incorporated herein by reference in its entirety.

TECHNICAL FIELD

This patent document relates to memory circuits or devices and their applications in electronic devices or systems.

BACKGROUND

The recent trend toward miniaturization, low power consumption, high performance, and multi-functionality in the electrical and electronics industry has compelled the semiconductor manufacturers to focus on high-performance, high capacity semiconductor devices. Examples of such high-performance, high capacity semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), and an electronic fuse (E-fuse).

SUMMARY

The disclosed technology in this patent document includes various embodiments of a semiconductor device including a memory cell that has a self-selecting memory layer having excellent operating characteristics and an easy manufacturing process.

In an embodiment, a semiconductor device includes a memory cell, which includes: a first electrode layer; a second electrode layer; and a self-selecting memory layer interposed between the first electrode layer and the second electrode layer and exhibits different resistance states for storing data and is structured to be either electrically conductive or electrically non-conductive in response to a voltage applied to the first and second electrode layers, wherein the self-selecting memory layer includes a ferroelectric layer exhibiting deep traps for trapping conductive carriers and a first dopant doped in the ferroelectric layer to form shallow traps providing a conductive path for conductive carriers to move in the ferroelectric layer.

In another embodiment, a semiconductor device includes a memory cell, which includes: a first electrode layer; a second electrode layer; and a self-selecting memory layer interposed between the first electrode layer and the second electrode layer, and including a ferroelectric layer, wherein the self-selecting memory layer exhibits different resistance states for storing data and is structured to be either electrically conductive or electrically non-conductive in response to a voltage applied to the first and second electrode layers, wherein the self-selecting memory layer is turned on when conductive carriers in a deep trap in the ferroelectric layer jump to a shallow trap while having different resistance states according to a polarization state of the ferroelectric layer.

DETAILED DESCRIPTION

Hereinafter, various embodiments of the disclosure will be described in detail with reference to the accompanying drawings.

Figure 1:
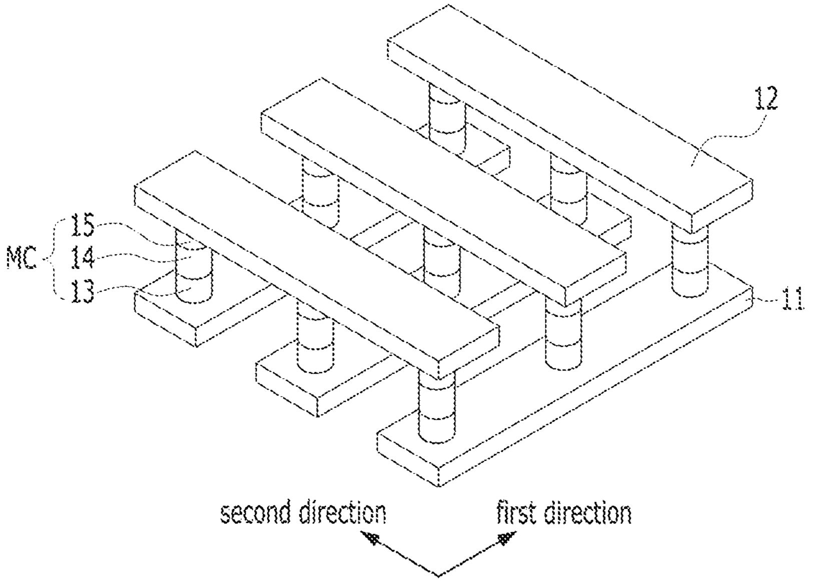
FIG. 1 is an example of a perspective view illustrating a memory device according to an embodiment of the disclosed technology.

FIG. 1 is a perspective view illustrating a memory device according to an embodiment of the disclosed technology.

Referring to FIG. 1, the memory device of the present embodiment may include a plurality of first conductive lines 11 extending in a first direction and parallel to each other, a plurality of second conductive lines 12 extending in a second direction crossing the first direction and parallel to each other while being spaced apart from the first conductive lines 11, and a plurality of memory cells MC interposed between the first conductive lines 11 and the second conductive lines 12 and respectively disposed at intersections of the first conductive lines 11 and the second conductive lines 12. In this patent document, the conductive lines can indicate conductive structures that electrically connect two or more circuit elements in the semiconductor memory. In some implementations, the conductive lines include word lines that are used control access to memory cells in the memory device and bit lines that are used to read out information stored in the memory cells. In some implementations, the conductive lines include interconnects that carry signals between different circuit elements in the semiconductor memory.

The memory cell MC may have various shapes. For example, the memory cell MC may have a pillar shape and arranged to be separated from the adjacent memory cell MC. In the present embodiment, the memory cell MC has a cylindrical shape. Other implementations are also possible. In another embodiment, the memory cell MC may have a square pillar shape that has both sidewalls aligned with both sidewalls of the second conductive line 12 in the first direction and both sidewalls aligned with both sidewalls of the first conductive line 11 in the second direction.

The memory cell MC may include a first electrode layer 13, a second electrode layer 15, and a self-selecting memory layer 14 interposed between the first electrode layer 13 and the second electrode layer 15.

The first electrode layer 13 and the second electrode layer 15 may be located at both ends, for example, at the lower and upper ends, respectively, of the memory cell MC to transmit a voltage or current required for the operation of the memory cell MC. The first electrode layer 13 and/or the second electrode layer 15 may include various conductive materials, for example, a metal such as platinum (Pt), tungsten (W), aluminum (Al), copper (Cu), tantalum (Ta), titanium (Ti), and the like, a metal nitride such as titanium nitride (TiN) and tantalum nitride (TaN), or a combination thereof. Alternatively, the first electrode layer 13 and/or the second electrode layer 15 may include a carbon electrode. At least one of the first electrode layer 13 and the second electrode layer 15 may be omitted. In this case, the first conductive line 11 may function as the first electrode layer 13 instead of the omitted first electrode layer 13, and the second conductive line 12 may function as the second electrode layer 15 instead of the omitted second electrode layer 15.

The self-selecting memory layer 14 may be configured to operate as a memory element and a selection element. In some implementations, the self-selecting memory layer 14 may have a variable resistance characteristic exhibiting different resistance states or values to operate as the memory element for storing different data using the different resistance states of the self-selecting memory layer 14 (e.g., using high and low resistance states to represent digital level "1" and "0") by setting the self-selecting memory layer 14 into a desired resistance state, and to change a stored data bit by switching between different resistance states according to a voltage applied to the first electrode layer 13 and the second electrode layer 15. At the same time, the self-selecting memory layer 14 may have a threshold switching characteristics to operate as the selection element to turn on the self-selecting memory layer 14 to be electrically conductive to select the memory cell to be operative or to turn off the self-selecting memory layer 14 to be electrically nonconductive to select the memory cell to be nonoperative. The threshold switching characteristic of the self-selecting memory layer 14 may turn on or turn off the self-selecting memory layer 14 based on a voltage applied to the first electrode layer 13 and the second electrode layer 15. When a magnitude of the applied voltage is less than a predetermined threshold value, the self-selecting memory layer 14 may be turned off to be electrically non-conductive and a current flowing through the self-selecting memory layer 144 is blocked or substantially limited. When a magnitude of the applied voltage is equal to or greater than the predetermined threshold value, the self-selecting memory layer 14 may be turned on to be electrically conductive and a current flowing through the self-selecting memory layer 144 abruptly increases. In the descriptions below, a threshold voltage is described as an example of the threshold value, and the self-selecting memory layer 14 may be implemented in a turned-on state or a turned-off state based on the threshold voltage.

In this case, the threshold voltage of the self-selecting memory layer 14 may depend on the resistance state of the self-selecting memory layer 14. Thus, the self-selecting memory layer 14 may have different threshold voltages according to different resistance states. For example, when the self-selecting memory layer 14 is in a low resistance state, it may have a first threshold voltage, and when the self-selecting memory layer 14 is in a high resistance state, it may have a second threshold voltage different from the first threshold voltage. Accordingly, it is possible to implement the self-selecting memory layer, which is a single layer, to simultaneously operate a memory element and a selection element.

As a result, data can be stored in each of the plurality of memory cells MC including the self-selecting memory layer 14, while the current leakage between the memory cells MC sharing the first conductive line 11 or the second conductive line 12 can be prevented.

According to the present embodiment, by configuring a single layer (e.g., the self-selecting memory layer 14) to simultaneously function as a memory element and as a selection element, it is possible to save processing efforts and costs as compared to the case when the memory element and the selection element are separately manufactured. In addition, the degree of integration of the memory device can be secured since the manufacturing process is simplified by facilitating the implementation of a memory device having a cross-point structure including the memory cells MC.

Various implementations, to be further discussed, propose a memory cell including a self-selecting memory layer with excellent operating characteristics and an easy manufacturing process, and an operation method of the memory cell.

Figure 2:
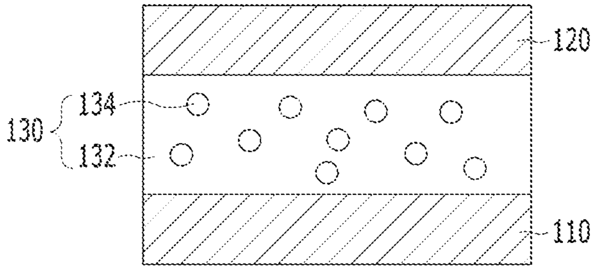
FIG. 2 is an example of a cross-sectional view illustrating a memory cell according to an embodiment of the disclosed technology.

FIG. 2 is a cross-sectional view illustrating a memory cell according to an embodiment of the disclosed technology.

Referring to FIG. 2, the memory cell according to the present embodiment may include a first electrode layer 110, a second electrode layer 120, and a self-selecting memory layer 130 interposed between the first electrode layer 110 and the second electrode layer 120.

The first electrode layer 110 and/or the second electrode layer 120 may include various conductive materials, for example, a metal such as platinum (Pt), tungsten (W), aluminum (Al), copper (Cu), tantalum (Ta), and titanium (Ti), a metal nitride such as titanium nitride (TiN) and tantalum nitride (TaN), or a combination thereof. Alternatively, the first electrode layer 110 and/or the second electrode layer 120 may include a carbon electrode. One of the first electrode layer 110 and the second electrode layer 120 may correspond to the first electrode layer 13 or the first conductive line 11 of FIG. 1 described above, and the other may correspond to the second electrode layer 15 or the second conductive line 12 of FIG. 1 described above.

The self-selecting memory layer 130 may include, in some implementations, a ferroelectric layer 132 and a first dopant 134 doped in the ferroelectric layer 132 by an ion implantation or others.

The ferroelectric layer 132 may exhibit an electric polarization due to the alignment of internal electric dipole moments, and may store different data by having different resistance states depending on the direction or state of the polarization. Even if an electric field applied to the self-selecting memory layer 130 from an external source is removed, this polarization can be maintained, which allows the resistance state of the ferroelectric layer 132 to be substantially maintained. Thus, the ferroelectric layer 132 may function as a nonvolatile memory element.

In various implementations, the ferroelectric layer 132 may include an oxide ferroelectric, a fluoride ferroelectric, a ferroelectric semiconductor, a polymer ferroelectric, or a combination thereof. The oxide ferroelectric may include perovskite ferroelectric such as PZT ($PbZr_xTi_{1-x}O_3$), $BaTiO_3$, and $PbTiO_3$, pseudo-ilmenite ferroelectric such as $LiNbO_3$ and $LiTaO_3$, tungsten-bronze (TB) ferroelectric such as $PbNb_3O_6$ and $Ba_2NaNb_5O_{15}$, bismuth layered-structure ferroelectric such as SBT ($SrBi_2Ta_2O_9$), BLT ($(Bi,La)_4Ti_3O_{12}$), and $Bi_4Ti_3O_{12}$, pyrochlore ferroelectric such as $La_2Ti_2O_7$, solid solution of these ferroelectrics, $RMnO_3$ containing a rare earth element R such as Y, Er, Ho, Tm, Yb, and Lu, PGO ($Pb_5Ge_3O_{11}$), BFO ($BiFeO_3$), or others. Alternatively, the oxide ferroelectric may include a metal oxide having a fluorite structure so as to exhibit ferroelectricity due to an orthorhombic phase. For example, the oxide ferroelectric may include hafnium oxide (HfOx) doped with an element such as Si, Al, La, Zr, Y, Gd, Sr, and Ge, zirconium oxide (ZrOx), titanium oxide (TiOx), hafnium zirconium oxide (HfZrOx), hafnium titanium oxide (HfTiOx), hafnium silicon oxide (HfSiOx), nickel oxide (NiO), tantalum oxide (TaOx), aluminum oxide (AlOx), zirconium oxide (ZrOx), copper oxide (CuOx), niobium oxide (NbOx), tantalum oxide (TaOx), gallium oxide (GaOx), gadolinium oxide (GdOx), manganese oxide (MnOx), PrCaMnO, ZnONiOx, or the like. The ferroelectric semiconductor may include a group 2-6 compound such as CdZnTe, CdZnS, CdZnSe, CdMnS, CdFeS, CdMnSe, and CdFeSe. The polymer ferroelectric may include at least one of polyvinylidene fluoride (PVDF), a polymer containing PVDF, a copolymer containing PVDF, a terpolymer containing PVDF, an odd number nylon, a cyanopolymer, a polymer thereof, or a copolymer thereof. However, the disclosed technology is not limited thereto, and the ferroelectric layer 130 may include various materials having ferroelectric properties.

The ferroelectric layer 132 may include a deep trap capable of trapping electrons. The energy level of the deep trap may be similar to the energy level of a valence band of the ferroelectric material for forming the ferroelectric layer 132.

The first dopant 134 may include an element that can create a shallow trap providing a path for conductive carriers, e.g., electrons in the ferroelectric layer 132, while the first dopant 134 itself is substantially immobile within the ferroelectric layer 132. The energy level of the shallow trap generated by the first dopant 134 may be greater than the energy level of the deep trap of the ferroelectric layer 132. In addition, the energy level of the shallow trap may be greater than the work function of at least one of the first and second electrode layers 110 and 120 and smaller than the energy level of a conduction band of the ferroelectric layer 132. In order to generate the shallow trap, various elements that are different from the constituent elements of the ferroelectric layer 132 and generate an energy level capable of accommodating the conductive carriers in the ferroelectric layer 132 may be used as the first dopant 134. For example, the first dopant 134 may include at least one of aluminum (Al), lanthanum (La), niobium (Nb), vanadium (V), tantalum (Ta), tungsten (W), chromium (Cr), molybdenum (Mo), boron (B), nitrogen (N), carbon (C), phosphorus (P), arsenic (As), titanium (Ti), copper (Cu), zirconium (Zr), or hafnium (Hf), or a combination thereof.

When a voltage equal to or greater than the threshold voltage is applied to the self-selecting memory layer 130, the conductive carriers trapped in the deep trap may jump to the shallow trap by thermal emission or tunneling, and thus, the conductive carriers may move through the shallow trap. Accordingly, the self-selecting memory layer 130 may have an ON state in which a current flows through the self-selecting memory layer 130 between the first electrode layer 110 and the second electrode layer 120. When the voltage applied to the self-selecting memory layer 130 is reduced below the threshold voltage, the number of conductive carriers moving from the deep trap to the shallow trap may be reduced, and thus, the movement of the conductive carriers through the shallow trap may be suppressed. Accordingly, the self-selecting memory layer 130 may have an OFF state in which a current does not flow or the current is substantially limited. Here, the threshold voltage may be varied according to the above-described resistance state of the ferroelectric layer 132, for example, the polarization direction or state of the ferroelectric layer 132. For example, when the ferroelectric layer 132 has a first resistance state, which is referred to as a first polarization state, the self-selecting memory layer 130 may have a first threshold voltage. When the ferroelectric layer 132 has a second resistance state, which is referred to as a second polarization state, the self-selecting memory layer 130 may have a second threshold voltage different from the first threshold voltage. This is because the resistance state and polarization state of the ferroelectric layer 132 affect the jumping of conductive carriers from the deep trap to the shallow trap in the ferroelectric layer 132. Thus, the amount/number of conductive carriers jumping from the deep trap to the shallow trap in the first polarization state may be different from the amount/number of conductive carriers jumping from the deep trap to the shallow trap in the second polarization state. This will be further described with reference to FIGS. 3A to 3C and FIG. 4.

Figure 3A:
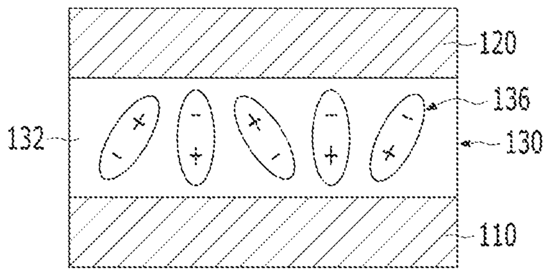
FIGS. 3A to 3C are example views illustrating a polarization state of a ferroelectric layer according to a voltage applied to a memory cell of FIG. 2.
Figure 3B:
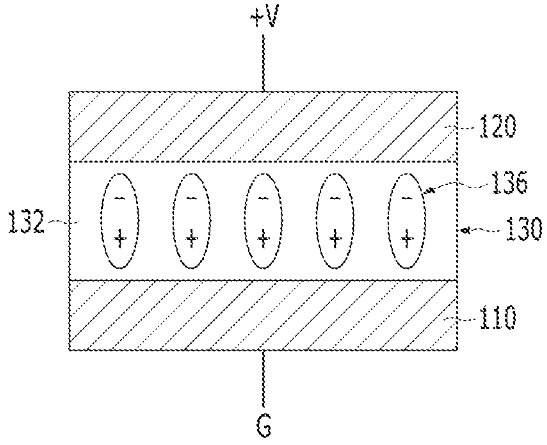
Figure 3C:
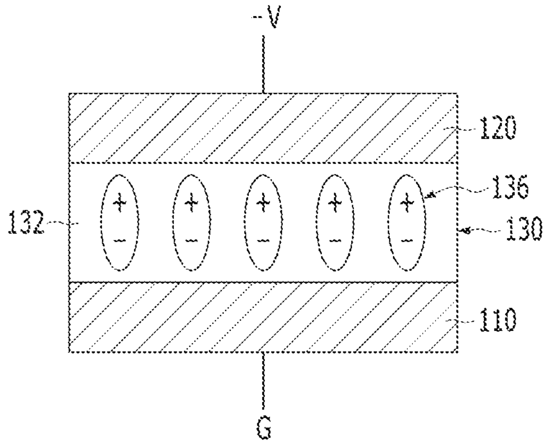

FIGS. 3A to 3C are views illustrating changes in a polarization state of a ferroelectric layer according to a voltage applied to the memory cell of FIG. 2. In FIGS. 3A to 3C, the first dopant 134 is present in the in the ferroelectric layer 132 of the memory cell of FIG. 2 but is not illustrated.

FIG. 3A illustrates an initial state after the memory cell of FIG. 2 is formed without the presence any applied voltage between the first and second electrode layers 110 and 120 so that electric dipole moments 136 of the ferroelectric layer 132 may be randomly distributed without being aligned in one direction. As illustrated, the random orientations of electric dipole moments 136 do not cause an overall net polarization in the ferroelectric layer 132.

Referring to FIG. 3B, a write voltage is applied to the first and second electrode layers 110 and 120 of the memory cell to perform a write operation. In this case, a relatively positive voltage may be applied to the second electrode layer 120 and a ground voltage may be applied to the first electrode layer 110. In FIG. 3B, a write voltage applied to the second electrode layer 120 is indicated by +V.

In response to this applied positive voltage +V, electric dipole moments 136 in the ferroelectric layer 132 may aligned by the electric field associated with the positive voltage +V and this alignment of electric dipole moments 136 produces a first polarization state in which the electric dipole moments 136 of the ferroelectric layer 132 are aligned so that negative charges are directed toward the second electrode layer 120 and positive charges are directed toward the first electrode layer 110. When the ferroelectric layer 132 has the first polarization state, the self-selecting memory layer 130 has a first resistance state. Furthermore, the self-selecting memory layer 130 in the first resistance state may have a first threshold voltage. As an example, the first resistance state may be in a low resistance state where the resistance value in the ferroelectric layer 132 is at a low value. Thus, the write operation may correspond to an operation of changing the resistance state of the ferroelectric layer 132 to the low resistance state.

Referring to FIG. 3C, an opposite negative voltage is applied between the electrode layers 110 and 120 as an erase voltage to perform an erase operation to the memory cell. In this case, a relatively negative voltage may be applied to the second electrode layer 120 and a ground voltage may be applied to the first electrode layer 110. In FIG. 3C, an erase voltage applied to the second electrode layer 120 is indicated by −V. The erase voltage may be a voltage having the same magnitude as the write voltage and having a polarity opposite to that of the write voltage.

Under this negative erase voltage −V, electric dipole moments 136 of the ferroelectric layer 132 realign their dipole directions to exhibit a second polarization state in which negative charges are directed toward the first electrode layer 110 and positive charges are directed toward the second electrode layer 120. The second polarization state may be opposite to the first polarization state. When the ferroelectric layer 132 exhibits the second polarization state, the self-selecting memory layer 130 has a second resistance state different from the first resistance state. The self-selecting memory layer 130 in the second resistance state may have a second threshold voltage different from the first threshold voltage. As an example, the second resistance state may be a high resistance state. Thus, the erase operation may correspond to an operation of changing the resistance state of the ferroelectric layer 132 to the high resistance state. In an example, a magnitude of the second threshold voltage may be greater than a magnitude of the first threshold voltage.

Figure 4:
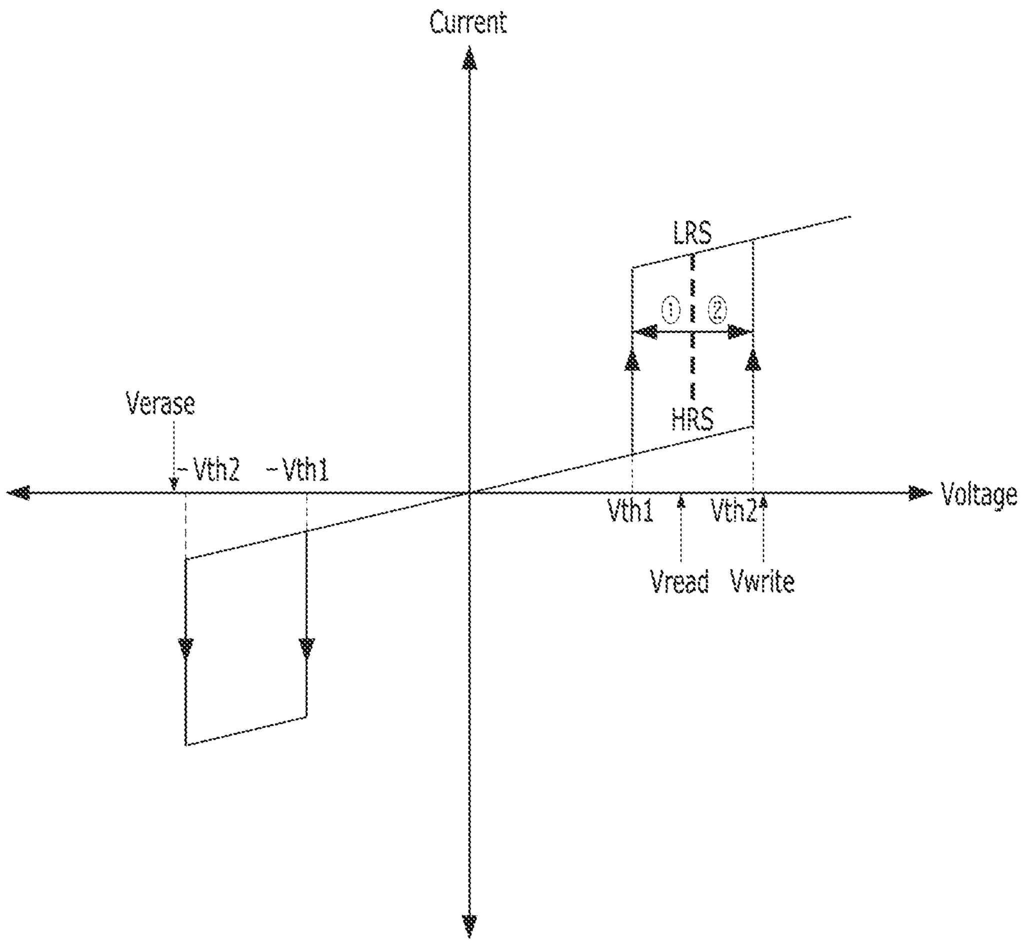
FIG. 4 is an example of a current-voltage graph for illustrating an operation of a memory cell of FIG. 2.

FIG. 4 is a current-voltage graph for illustrating the operation of the memory cell of FIG. 2. FIG. 4 illustrates the write operation of FIG. 3B and the erase operation of FIG. 3C. As discussed with FIGS. 3A to 3C, the write operation of FIG. 3B may correspond to an operation of changing the resistance state of the self-selecting memory layer to a low resistance state having a relatively small first threshold voltage by applying a positive write voltage, and the erase operation of FIG. 3C may correspond to an operation of changing the resistance state of the self-selecting memory layer to a high resistance state having a relatively large second threshold voltage by applying a negative erase voltage.

Referring to FIG. 4, two different cases are explained, i.e., the first case when the voltage is applied to the memory cell in the high resistance state HRS and the second case when the voltage is applied to the memory cell in the low resistance state LRS. The memory cell in the high resistance state HRS has a second threshold voltage Vth2. When the voltage applied to both ends of the memory cell in the high resistance state HRS is increased in the positive direction to reach the positive second threshold voltage Vth2, the memory cell may be turned on, and simultaneously be switched from the high resistance state HRS to the low resistance state LRS. When the memory cell enters the low resistance state LRS, the memory cell may have the first threshold voltage Vth1 having a lower magnitude than that of the second threshold voltage Vth2. Here, the magnitude of the voltage may mean an absolute value irrespective of the positive and negative directions.

The memory cell in the low resistance state LRS has a first threshold voltage Vth1. When the voltage applied to both ends of the memory cell in the low resistance state LRS is increased in the negative direction to reach the negative first threshold voltage −Vth1, the memory cell may be turned on, and simultaneously be switched from the low resistance state LRS to the high resistance state HRS. When the memory cell enters the high resistance state HRS, the memory cell may again have the second threshold voltage Vth2 having a magnitude greater than that of the first threshold voltage Vth1.

In this manner, the memory cell may switch between the low resistance state LRS and the high resistance state HRS.

The write operation and the erase operation on the memory cell may be performed using voltages having the same magnitude and opposite polarities. Accordingly, a positive write voltage Vwrite having a magnitude greater than or equal to the second threshold voltage Vth2 may be applied during the write operation, and a negative erase voltage Verase having a magnitude greater than or equal to the second threshold voltage Vth2 may be applied during the erase operation. Here, the write voltage Vwrite may correspond to a voltage indicated by +V in FIG. 3B, and the erase voltage Verase may correspond to a voltage indicated by −V in FIG. 3C.

During a read operation, a read voltage Vread having a magnitude between the first threshold voltage Vth1 and the second threshold voltage Vth2 may be applied. In the present embodiment, a positive read voltage Vread may be applied. This is because the self-selecting memory layer may be changed from the low resistance state LRS to the high resistance state HRS at the negative first threshold voltage Vth1. If a negative read voltage of the same magnitude as the positive read voltage Vread is applied, a destructive read operation in which the memory cell in the low resistance state LRS is changed to the high resistance state HRS during the read operation, may occur.

A dotted line indicated between the arrows ① and ② in FIG. 4 may show an operation of a device of a comparative example in which a first dopant for forming a shallow trap is doped in a normal insulating layer instead of a ferroelectric layer. In the case of the comparative example, since the polarization phenomenon of the ferroelectric layer does not exist, the memory cell is turn on or off only based on a voltage applied to the memory cell without any change of a threshold voltage, which allows the comparative device to function as a selection element only. In the case of a memory cell including a doped ferroelectric layer doped with a dopant as in the present embodiment, the threshold voltage may decrease (refer to arrow ①) or increase (refer to arrow ②) depending on the polarization of the ferroelectric layer, and accordingly, it may be possible to sense a difference in resistance state. Thus, the memory cell can function as a selection element and a memory element at the same time. Furthermore, the self-selecting memory layer in the memory cell can be provided by a simple process, for example, of doping dopants into the ferroelectric layer by ion implantation. Thus, the manufacturing process can be facilitated.

In FIGS. 3B, 3C, and 4, the write operation is performed by applying the positive write voltage to make the self-selecting memory layer have the low resistance state and the relatively small first threshold voltage, and the erase operation is performed by applying the negative erase voltage to make the self-selecting memory layer have the high resistance state and the relatively large second threshold voltage. Various implementations can be made as long as the resistance state and the threshold voltage state of the self-selecting memory layer vary according to the polarization state of the ferroelectric layer. For example, by applying a negative write voltage, a write operation in which a self-selecting memory layer has a low resistance state and a relatively small first threshold voltage may be performed, and by applying a positive erase voltage, an erase operation in which the self-selecting memory layer has a high resistance state and a relatively large second threshold voltage may be performed. Alternatively, for example, a self-selecting memory layer may have a low resistance state and a relatively large first threshold voltage, or a high resistance state and a relatively small second threshold voltage. That is, by applying a positive or negative write voltage, a write operation in which the self-selecting memory layer has the low resistance state and the relatively large first threshold voltage may be performed, and by applying a negative or positive erase voltage, an erase operation in which the self-selecting memory layer has the high resistance state and the relatively small second threshold voltage may be performed.

In addition, in order to maximize the polarization phenomenon during the write operation or the erase operation and at the same time to minimize the polarization change during the read operation, it may be necessary to maximize the difference between the magnitude of the write voltage or the erase voltage and the magnitude of the read voltage. At the same time, or alternatively, it may be necessary to make the pulse width of the write voltage or the erase voltage larger than the pulse width of the read voltage. This will be exemplarily described with reference to FIG. 5.

Figure 5:
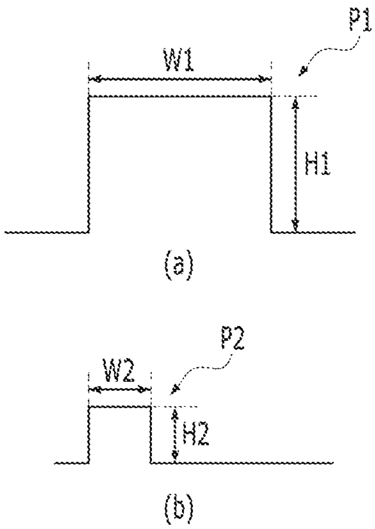
FIG. 5 is an example view for comparing a voltage pulse applied during a write operation or an erase operation and a voltage pulse applied during a read operation of a memory cell of FIG. 2.

FIG. 5 is a view for comparing a voltage pulse applied during a write operation or an erase operation of the memory cell of FIG. 2 and a voltage pulse applied during a read operation.

In FIG. 5, (a) shows a first voltage pulse P1 applied during a write operation or an erase operation of a memory cell. Here, the magnitude and width of the first voltage pulse P1 are denoted by H1 and W1, respectively.

In FIG. 5, (b) shows a second voltage pulse P2 applied during a read operation of a memory cell. Here, the magnitude and width of the second voltage pulse P2 are denoted by H2 and W2, respectively.

Here, the magnitude H1 of the first voltage pulse P1 may have a value of 2 times or more and 5 times or less of the magnitude H2 of the second voltage pulse P2. If the magnitude H1 of the first voltage pulse P1 exceeds 5 times, the memory cell may be damaged due to excessive voltage application. If the magnitude H1 of the first voltage pulse P1 is less than 2 times, the polarization for the write/erase operation may be insufficient.

Also, the width W1 of the first voltage pulse P1 may be greater than the width W2 of the second voltage pulse P2. This may be because the polarization is not affected as the width of the applied voltage pulse is shorter. Accordingly, the width W1 of the first voltage pulse P1 may be relatively large to induce sufficient polarization for the write/erase operation, and the width W2 of the second voltage pulse P2 may be relatively small to prevent the polarization change during the read operation. As an example, the width W1 of the first voltage pulse P1 may have a value of 10 times or more and 1000 times or less of the width W2 of the second voltage pulse P2.

According to the above-described embodiments, a semiconductor device including a memory cell that has a self-selecting memory layer having excellent operating characteristics and an easy manufacturing process, may be provided.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Enhancements and variations of the disclosed embodiments and other embodiments can be made based on what is described and illustrated in this patent document.

What is claimed is:

1. A semiconductor device having at least one memory cell, the memory cell comprising:
- a first electrode layer;
- a second electrode layer; and
- a self-selecting memory layer which is interposed between the first electrode layer and the second electrode layer, exhibits different resistance states for storing data, and is structured to be either electrically conductive or electrically non-conductive in response to a voltage applied to the first and second electrode layers, wherein the self-selecting memory layer includes:
- a ferroelectric layer including deep traps configured to trap conductive carriers and to suppress movement of the trapped conductive carriers when a voltage applied to the first and second electrode layers is less than a threshold voltage; and
- a first dopant doped in the ferroelectric layer to form shallow traps configured to provide a conductive path for the conductive carriers when the voltage applied to the first and second electrode layers is equal to or greater than the threshold voltage, wherein elements included in the first dopant include at least one of aluminum (Al), lanthanum (La), niobium (Nb), vanadium (V), tantalum (Ta), tungsten (W), chromium (Cr), molybdenum (Mo), boron (B), nitrogen (N), carbon (C), phosphorus (P), arsenic (As), titanium (Ti), copper (Cu), zirconium (Zr), or hafnium (Hf).

2. The semiconductor device according to claim 1, wherein an energy level of the shallow traps is greater than the energy level of the deep trap.

3. The semiconductor device according to claim 1, wherein the elements included in the first dopant are different from elements of the ferroelectric layer.

4. The semiconductor device according to claim 1, wherein the self-selecting memory layer has a low resistance state and a high resistance state, and
- a first threshold voltage of the self-selecting memory layer in the low resistance state is different from a second threshold voltage of the self-selecting memory layer in the high resistance state.

5. The semiconductor device according to claim 4, wherein the ferroelectric layer of the self-selecting memory layer in the low resistance state has a first polarization state, and
- the ferroelectric layer of the self-selecting memory layer in the high resistance state has a second polarization state different from the first polarization state.

6. The semiconductor device according to claim 4, wherein a resistance state of the self-selecting memory layer is changed from the high resistance state to the low resistance state in response to a write voltage having a first polarity, and is changed from the low resistance state to the high resistance state in response to an erase voltage having a second polarity different from the first polarity.

7. The semiconductor device according to claim 6, wherein a magnitude of the write voltage and a magnitude of the erase voltage are same.

8. The semiconductor device according to claim 6, wherein a magnitude of the write voltage and a magnitude of the erase voltage are equal to or greater than magnitudes of the first and second threshold voltages.

9. The semiconductor device according to claim 6, wherein, in a read operation for reading the resistance state of the self-selecting memory layer, a read voltage having a magnitude between the first threshold voltage and the second threshold voltage is applied.

10. The semiconductor device according to claim 9, wherein a magnitude of the read voltage has a value of 2 times or more and 5 times or less of a magnitude of the write voltage or the erase voltage.

11. The semiconductor device according to claim 9, wherein a pulse width of the read voltage is smaller than a pulse width of the write voltage or the erase voltage.

12. A semiconductor device having at least one memory cell, the at least one memory cell comprising:

a first electrode layer;

a second electrode layer; and a self-selecting memory layer interposed between the first electrode layer and the second electrode layer and being structured to be turned on and off according to movement of conductive carriers between traps in a ferroelectric layer, wherein the self-selecting memory layer includes:

a ferroelectric layer including deep traps configured to trap conductive carriers and to maintain the self-selecting memory layer in a non-conductive state when a voltage applied to the first and second electrode layers is less than a threshold voltage; and a dopant doped in the ferroelectric layer to form shallow traps configured to receive the conductive carriers released from the deep traps and to enable a conductive state of the self-selecting memory layer when the voltage applied to the first and second electrode layers is equal to or greater than the threshold voltage, wherein elements included in the dopant include at least one of aluminum (Al), lanthanum (La), niobium (Nb), vanadium (V), tantalum (Ta), tungsten (W), chromium (Cr), molybdenum (Mo), boron (B), nitrogen (N), carbon (C), phosphorus (P), arsenic (As), titanium (Ti), copper (Cu), zirconium (Zr), or hafnium (Hf), and wherein the self-selecting memory layer is turned on when conductive carriers move from the deep traps to the shallow traps, and an amount of the conductive carriers moving from the deep traps to the shallow traps depends on a polarization state of the ferroelectric layer.

13. The semiconductor device according to claim 12, wherein an amount of the conductive carriers jumping from the deep trap to the shallow trap in a first polarization state of the ferroelectric layer is different from that in a second polarization state of the ferroelectric layer.

* * * * *